United States Patent
Godet et al.

(10) Patent No.: US 9,340,877 B2
(45) Date of Patent: May 17, 2016

(54) METHOD AND SYSTEM FOR MODIFYING PHOTORESIST USING ELECTROMAGNETIC RADIATION AND ION IMPLANTATION

(71) Applicant: VARIAN SEMICONDUCTOR EQUIPMENT ASSOCIATES, INC., Gloucester, MA (US)

(72) Inventors: Ludovic Godet, Boston, MA (US); Patrick M. Martin, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 239 days.

(21) Appl. No.: 13/888,693

(22) Filed: May 7, 2013

(65) Prior Publication Data

US 2013/0247824 A1    Sep. 26, 2013

Related U.S. Application Data

(62) Division of application No. 12/896,036, filed on Oct. 1, 2010, now Pat. No. 8,435,727.

(51) Int. Cl.
| | | |
|---|---|---|
| *G03B 27/42* | (2006.01) | |
| *C23C 16/50* | (2006.01) | |
| *G03F 7/20* | (2006.01) | |
| *H01J 37/32* | (2006.01) | |
| *H01L 21/027* | (2006.01) | |
| *G03F 7/40* | (2006.01) | |
| *G03F 7/42* | (2006.01) | |

(52) U.S. Cl.
CPC ............... *C23C 16/50* (2013.01); *G03F 7/405* (2013.01); *G03F 7/7045* (2013.01); *G03F 7/70875* (2013.01); *H01J 37/32357* (2013.01); *H01J 37/32412* (2013.01); *H01J 37/32422* (2013.01); *H01L 21/0273* (2013.01); *G03F 7/427* (2013.01)

(58) Field of Classification Search
CPC ... G03F 7/7045; G03F 7/70875; G03F 7/405; G03F 7/427; H01J 37/32357; H01J 37/32412; H01J 37/32422; H01L 21/0273; C23C 16/50
See application file for complete search history.

(56) References Cited

U.S. PATENT DOCUMENTS

| | | | | |
|---|---|---|---|---|
| 4,450,031 | A | * | 5/1984 | Ono et al. ............... 156/345.39 |
| 2009/0155731 | A1 | | 6/2009 | Urakawa |
| 2010/0081285 | A1 | | 4/2010 | Chen et al. |
| 2010/0187770 | A1 | | 7/2010 | Miyake et al. |
| 2011/0024651 | A1 | * | 2/2011 | Schimmel et al. ........ 250/504 R |

FOREIGN PATENT DOCUMENTS

| | | |
|---|---|---|
| JP | 2006278006 A | 10/2006 |
| TW | 200947550 A | 11/2009 |
| TW | 201009931 A | 3/2010 |

OTHER PUBLICATIONS

Search Report from corresponding Taiwan Patent Application No. 100134807, mailed Feb. 19, 2016.

* cited by examiner

*Primary Examiner* — Mesfin T Asfaw

(57) ABSTRACT

A method of reducing surface roughness of a resist feature disposed on a substrate includes generating a plasma having a plasma sheath and ions therein. A shape of the boundary between the plasma and plasma sheath is modified using a plasma sheath modifier, so that a portion of the boundary facing the substrate is not parallel to a plane defined by the substrate. During a first exposure, the resist feature is exposed to electromagnetic radiation having a desired wavelength and the ions are accelerated across the boundary having the modified shape toward the resist features over an angular range.

4 Claims, 11 Drawing Sheets

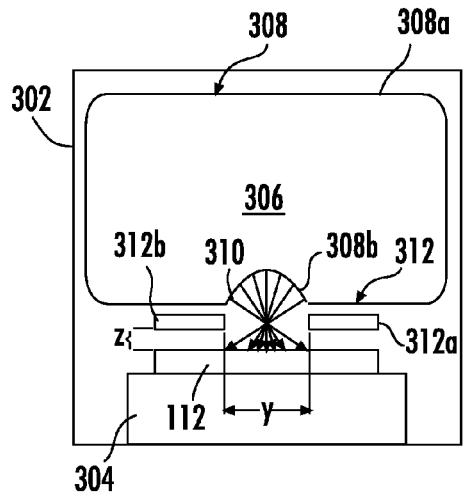
FIG. 3A
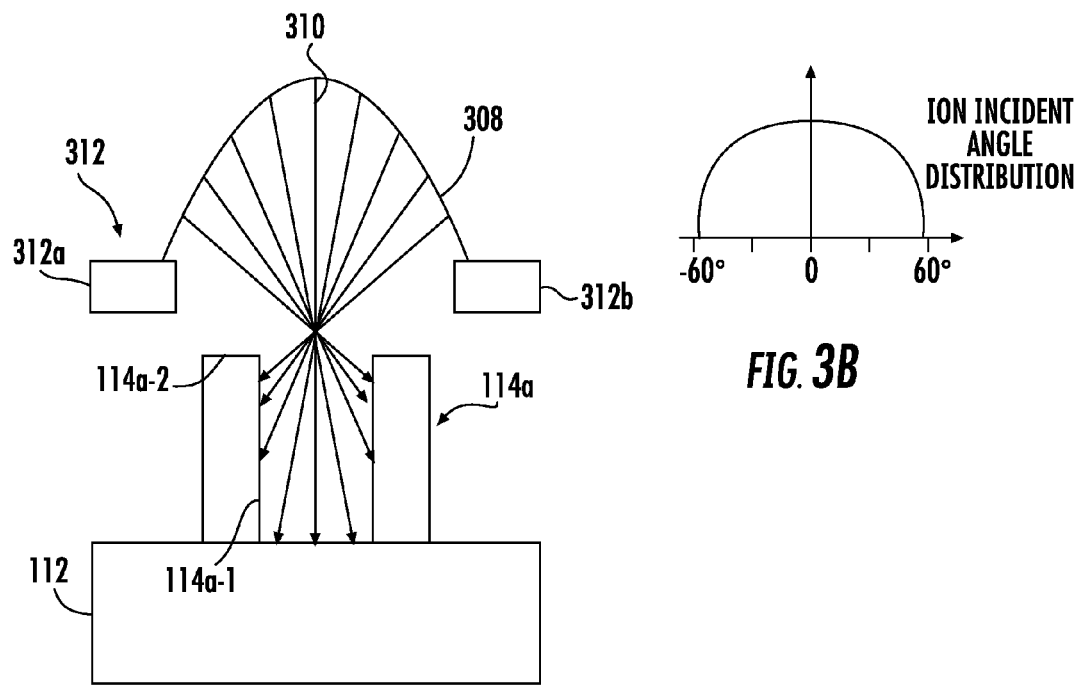
FIG. 3B
FIG. 4

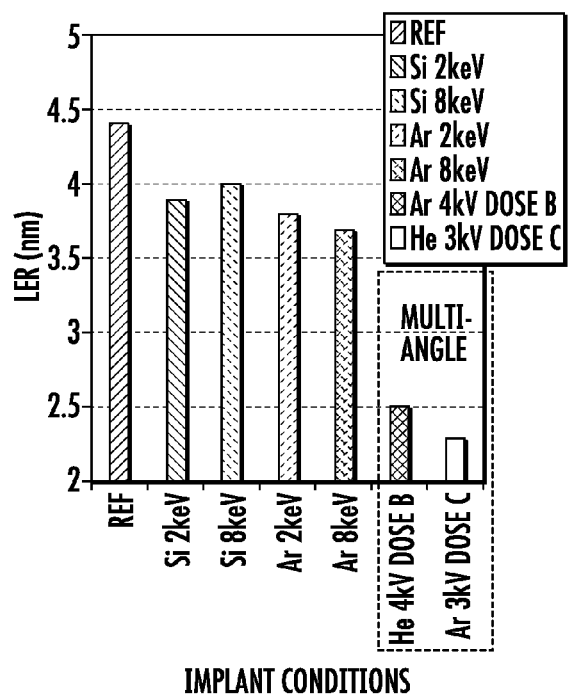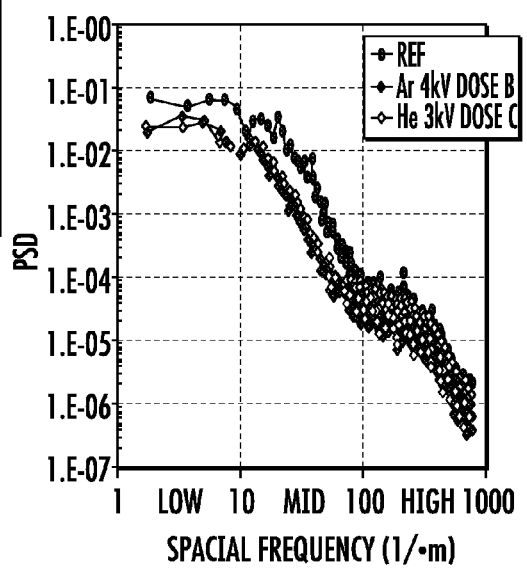
FIG. 5                    FIG. 6

METHOD AND SYSTEM FOR MODIFYING PHOTORESIST USING ELECTROMAGNETIC RADIATION AND ION IMPLANTATION

BACKGROUND OF THE INVENTION

1. Field of the Invention

Embodiments of the invention relate to the field of device manufacturing. More particularly, the present invention relates to a method, system and structure for patterning a substrate and for implanting into a substrate for manufacturing a device.

2. Discussion of Related Art

Optical lithography is often used in manufacturing electronic devices. It is a process by which a substrate is patterned so that circuit may be formed on the substrate according to the pattern. Referring to FIG. 1a-1e, there are shown simplified illustrations of the optical lithographic process. Generally, the substrate 112 is coated with photo-curable, polymeric photoresist 114 (FIG. 1a). Thereafter, a mask 142 having a desired aperture pattern is disposed between the substrate 114 and a light source (not shown). The light 10 from the light source is illuminated onto the substrate 112 via the aperture of the mask 142, and the light transmitted through the mask's aperture (or the image of the pattern) is projected onto the photoresist 114. A portion of the photoresist 114a is exposed to the light 10 and cured, whereas the rest of the photoresist 114b remains uncured (FIG. 1b). As a result, an image of the mask's aperture may form by the cured portion of the photoresist 114a.

As illustrated in FIG. 1c, the uncured portion of the photoresist 114b is stripped, and 3D photoresist feature or relief 114a corresponding to the mask's aperture pattern may remain on the substrate 112. Thereafter, the substrate is etched, and trenches 116 corresponding to the negative image of the mask's aperture pattern may form (FIG. 1d). After the remaining photoresist 114b is removed, a patterned substrate 112 may form (FIG. 1e). If a metallic layer is deposited on the trenches, a circuit having a desired pattern may be formed on the substrate 112.

Referring to FIG. 2, there is shown a conventional optical lithographic system 200 for projecting the image of the mask's aperture pattern to the substrate. The optical lithography system 200 comprises a light source 222, an optical integrator 232, and a condenser lens 234. In addition, the optical lithography system 200 comprises mask 142 having a desired aperture pattern and a projection lens 252. As illustrated in the figure, light having desired wavelength is emitted from the light source 222 to the optical integrator 232 and the condenser lens 234, which are collectively known as an illuminator 230. In the illuminator 230, the light 10 is expanded, homogenized, condensed, or otherwise conditioned. The light 10 is then illuminated onto the mask 142 having the desired aperture pattern to be projected onto the substrate 112. The light 10 transmitted through the apertures of the mask 142 may contain the information on the mask's aperture pattern. The light 10 is then captured by the projection lens 252 which projects the light 10 or the image of the mask's aperture pattern onto the photoresist deposited on the substrate 112. In projecting the image, the projection lens 10 may reduce the image by a factor of four or five.

To generate circuit patterns with smaller feature size (e.g. width of the trench), several modifications have been implemented into the process. As known in the art, the ability to project a clear image of a small feature may depend on, among others, the wavelength of the light used in the process. Currently, ultraviolet (UV) light with wavelengths of 365 nm and 248 nm, and 193 nm are used.

Although optical lithography is an efficient process with high throughput, the process is not without disadvantages. One disadvantage may include line width roughness (LWR) or line edge roughness (LER). As known in the art, LWR is excessive variations in the width of the photoresist feature formed after uncured portion of the photoresist 114b is stripped from the substrate. If the variations occur on the side surface of the photoresist relief or feature, the variations is known as LER. The roughness or variations due to LWR or LER may be disadvantageous as the variation may be transferred onto the trenches during etch and ultimately to the circuit. The variations become more significant with decrease in feature size of the photoresist relief or trenches. For 32 nm devices variations of 4 nm or larger have been observed. Because the geometrical shape of a patterned resist feature, including line roughness effects, such as LWR and LER, is transferred from a resist layer to an underlying permanent layer of a device during patterning of the underlying layer, LWR and LER can limit the ability to form devices of acceptable quality for dimensions below about 100 nm. Such variations may lead to non-uniform circuits and ultimately device degradation or failure. In addition, depending on design criteria, device performance may be impacted more by either one of short, medium, or long range roughness.

Several approaches have been attempted to address LWR and LER effects. In one example, dry chemical etch process have the ability to remove resist, but generally suffer from pattern dependent loading effects, in which the removal is different in densely patterned regions as opposed to isolated features. Such dry chemical etching processes may also impart unwanted defects into a resist pattern, which could result in yield loss. In addition, it is important that any process used to address LWR/LER effects in resist, leave the original resist attributes, such as resist height, width, and profile, intact, in order to maintain tight control of critical dimension (CD) of underlying features to be patterned.

Another approach has been to use deep ultraviolet (DUV) curing by exposing a rough pattern to a UV lamp in which heating through radiation exposure is used to smooth out rough lines. This approach has the unwanted side effect of causing pattern pullback at line segment corners, causing lines to deform in such a way as to render devices useless.

In order to address the diffraction limit of UV lithography processing of resist, where lines or other patterns may have CD feature sizes below the diffraction limit of the illuminating radiation, double patterning lithography (DPL) has been developed. Multiple approaches have been developed to attempt to ensure success of DPL, including self aligned double patterning lithography and chemical freeze lithography. However, each of these processes may have both advantages and disadvantages with respect to cost and/or yield.

In view of the above, it will be appreciated that there is a need to improve resist lithography processes for technologies requiring very small feature sizes, such as sub-100 nm CD devices.

SUMMARY OF THE INVENTION

Embodiments of the present invention are directed to methods and systems for improving patterning a substrate, in particular, by improving roughness in a set of resist features used to pattern an underlying substrate. In an exemplary embodiment, a method of reducing surface roughness of a resist feature disposed on a substrate includes generating a plasma having a plasma sheath and ions therein. A shape of the boundary between the plasma and plasma sheath is modified using a plasma sheath modifier, so that a portion of the boundary facing the substrate is not parallel to a plane defined by the substrate. During a first exposure, the resist feature is exposed to electromagnetic radiation having a desired wavelength and the ions are accelerated across the boundary having the modified shape toward the resist features over an angular range.

In another embodiment, a method is provided for modifying roughness in a patterned resist feature having a first roughness and provided on a substrate. The method includes generating a plasma having a plasma sheath and ions therein, providing a plasma sheath modifier (PSM) defining an aperture that is operable to modify a shape of a boundary between the plasma and the plasma sheath, and accelerating ions across the boundary having the modified shape toward the patterned resist feature during a first exposure. The method further includes exposing, during at least a portion of the first exposure, the patterned resist feature to electromagnetic radiation emitted from the plasma and having a first wavelength range, wherein the patterned resist feature exposed to the ions and the electromagnetic radiation having the first wavelength range exhibits a second roughness that is less than the first roughness.

In another embodiment, a system for processing resist features disposed on a substrate includes a plasma source configured to generate a plasma having a plasma sheath and a plasma sheath modifier disposed between the plasma and the substrate. The plasma sheath modifier is configured to control a shape of a boundary defined between the plasma and the plasma sheath such that a portion of the shape of the boundary is not parallel to a plane defined by the substrate in front of the plasma, and is configured to transmit electromagnetic radiation having a desired wavelength range, the electromagnetic radiation being emitted from the plasma.

In a further embodiment, a method of reducing roughness in a resist feature includes generating a plasma having a plasma sheath, modifying a shape of a boundary defined between the plasma and the plasma sheath with a plasma sheath modifier such that a portion of the shape of the boundary is not parallel to a plane defined by the substrate facing the plasma, maintaining temperature of the substrate from about 30° C. to about 300° C. during the first exposure, and impinging ions from the plasma on the resist feature over an angular range during a first exposure so as to decrease the roughness of the resist features.

BRIEF DESCRIPTION OF THE DRAWINGS

FIG. 3a is a schematic depiction of a substrate processing system, in accordance with one embodiment of the present invention.

FIG. 3b illustrates an exemplary angular distribution of incident particles on a substrate, as provided by embodiments of the present invention.

FIG. 4 depicts a schematic cross section of a plasma sheath modifier and a resist feature that illustrate exemplary features of the invention.

FIG. 5 is a graph that presents exemplary LER data for resist lines before and after exposure to ions extracted from a plasma system using a plasma sheath modifier arranged in accordance with the present invention.

FIG. 6 is a graph that presents exemplary data depicting frequency variation in roughness for resist lines before and after exposure to ions extracted from a plasma system using a plasma sheath modifier arranged in accordance with the present invention.

DESCRIPTION OF EMBODIMENTS

Figure 1A:
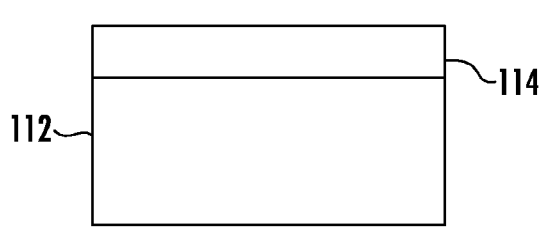
FIGS. 1a-1e are schematic cross-sections of a substrate that illustrate steps of a conventional optical lithographic process.
Figure 1C:
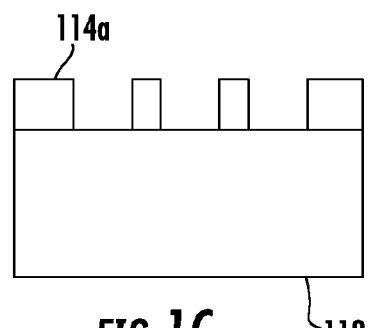
Figure 1D:
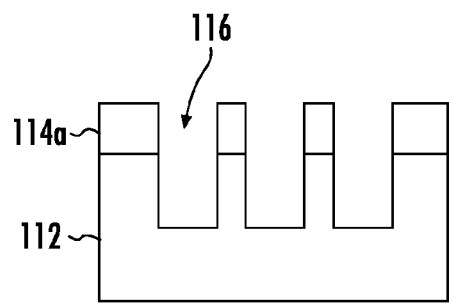
Figure 1B:
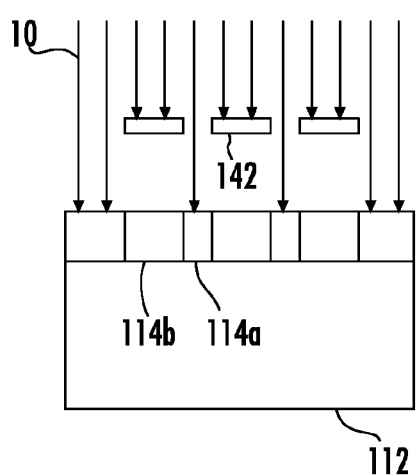
Figure 1E:
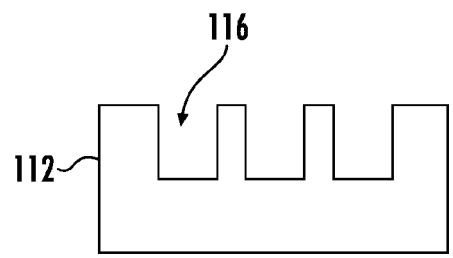
Figure 2:
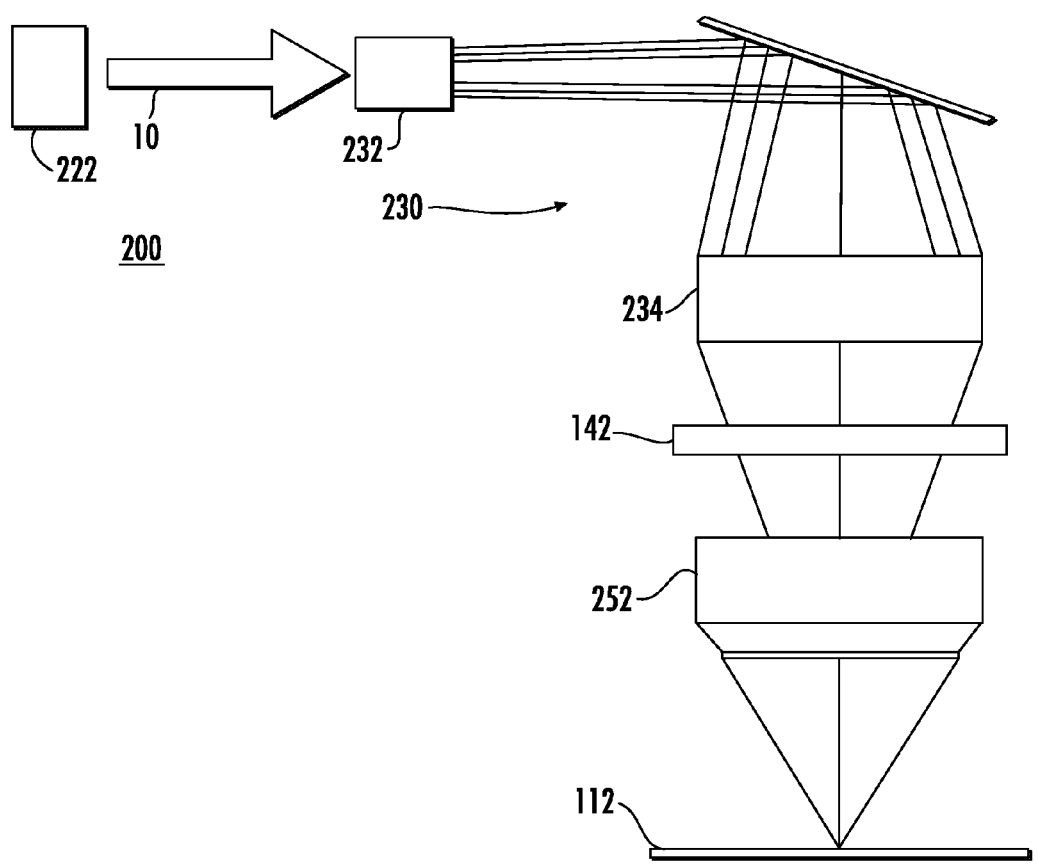
FIG. 2 is a schematic depiction of a conventional optical lithographic system for projecting the image of a mask's aperture pattern onto a substrate.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for patterning a substrate are introduced. In particular, the present disclosure focuses on techniques involving ion implantation processes for improving the quality of resist features, such as improving LWR and LER in resist features. The processes disclosed herein may be used in conjunction with processes for forming narrow features, including features that are incorporated into arrays having very small pitch, for example a pitch less than about 250 nm. Such processes include conventional DUV lithography, double patterning lithography, self aligned double patterning lithography, and other lithographic processes. However, those of ordinary skill in the art will recognize that the techniques disclosed herein are not limited to use in conjunction with any particular lithography or any range of resist feature dimensions.

Some embodiments of the invention employ plasma immersion implantation processes to treat resist features having very small dimensions. Several embodiments comprising new techniques for processing three dimensional (3D) structures are disclosed. For the purposes of clarity and simplicity, the embodiments are described as techniques for processing photoresist having surfaces oriented at multiple angles. However, those of ordinary skill in the art will recognize that the present disclosure is not limited thereto. The structure may be any type of structure having surfaces oriented at different angles.

The embodiments are also described as techniques using plasma based substrate processing systems. However, those of ordinary skill in the art will recognize that other types of sub-atomic, atomic, or molecular particle based substrate processing systems, including plasma sputtering, as well as beam line ion implantation systems, are within the scope of the present disclosure.

Referring to FIG. 3a, there is shown a substrate processing system 300 for processing 3D a structure according to one embodiment of the present invention. FIG. 3b illustrates angular distribution of the particles treating the photoresist. The figures are not necessarily drawn to scale.

As illustrated in FIG. 3a, the system 300 may include a process chamber 302 in which the substrate 112 and a platen 304 supporting the substrate 112 are disposed. In the present disclosure, the substrate 112 may be a metallic, semiconducting, or insulating material based substrate. In the present disclosure, patterned photoresist may be disposed on the substrate. The patterned photoresist may be a cured portion of the photoresist remaining on the substrate after an uncured portion is stripped.

The system 300 may also include a plasma source (not shown) for generating plasma 306 contained in the processing chamber 302. The plasma source may be an in situ or remote, inductively coupled plasma source, capacitively coupled plasma source, helicon source, microwave source, or any other type of plasma source. Those of ordinary skill in the art will also recognize that in some instances the platen 304 may act as the plasma source.

Between the plasma 306 and the substrate 112, one or more plasma sheath modifiers 312 may be disposed. In the present embodiment, the plasma sheath modifier 312 may comprise a pair of modifier parts 312a and 312b spaced apart from one another by a gap "y." In another embodiment, the modifier 312 may comprise a single modifier part. Yet in other embodiments, the modifier 312 may comprise three or more modifier parts spaced apart from one another defining the gap.

The plasma sheath modifier 312 may be capable of adjusting the electric field of the plasma sheath. In some embodiments, the plasma sheath modifier 312 may be positively or negatively charged. The plasma sheath modifier 312 may be made from electrically insulating (e.g. quartz) or conducting (e.g. metallic) material, or a combination thereof. Alternatively, the plasma sheath modifier 312 may be made from semiconducting (e.g. Si) material. If the system 300 includes more than one modifier parts, the parts may be made from the same or different material. For example, the system 300 may include a plasma sheath modifier 312 comprised of two modifier parts 312a and 312b. The modifier parts 312a and 312b may be made from the same material or different materials.

If the plasma sheath modifier 312 comprises two or more parts, the parts may be disposed on the same plane or different planes. For example, the plasma sheath modifier 312 included in the processing system 300 may comprise two modifier parts 312a and 312b and the parts may be disposed in the same plane such that the vertical spacings "z" between the substrate 112 and each modifier part 312a are the same. In another embodiment, the modifier 312 may comprise two modifier parts 312a and 312b, and each part 312a and 312b may be spaced apart from the substrate 112 by different vertical spacings "z." Additional description of the processing system with the plasma sheath modifier can be found in co-pending U.S. patent application Ser. No.: 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; and Ser. No. 12/848,354, filed Aug. 2, 2010, each of which is herein incorporated in its entirety by reference.

In operation, plasma generated in situ or remotely may be contained in the processing chamber 302. The plasma 306 may contain fragments including electrons, proton, and atomic or molecular ions, neutrals, and radicals of desired species. In the present disclosure, the plasma fragments may be used to dope, etch, or deposit material on the substrate 112. The species contained in the plasma 306 are not limited to one or more particular species. The species may include one or more elements from Group I and 3A-8A. Example of the species contained in the may include hydrogen (H), helium (He) or other rare gases, carbon (C), oxygen (O), nitrogen (N), arsenic (As), boron (B), phosphorus (P), antimony, gallium (Ga), indium (In), carborane $C_2B_{10}H_{12}$ or other molecular compounds. As illustrated in FIG. 3, the plasma 306 may also include plasma sheath 308 near the periphery. In the present embodiment, the plasma sheath 308 may comprise positively charged ions 310.

As depicted in the Figures, sheath 308 is represented by a boundary of the sheath with plasma 306. However, it will be understood that sheath 308 may extend a finite distance from an edge of plasma 306 to surfaces of objects around plasma 306, for example, the sheath 308 may extend to the surface of substrate 112.

The ions 310 in the plasma sheath 308 or the plasma 306 may be directed toward the substrate 112, as the substrate 112 is biased by a DC or RF bias supply (not shown). The bias signal applied to the substrate 112, whether DC or RF, may be continuous or pulsed.

The plasma sheath modifier 312 may modify the shape of the plasma sheath 308 so as to control the incident angle distribution of the ions 310. For example, the plasma sheath modifier 312 may modify the electric field in the plasma sheath 242 and modify the shape of the plasma sheath 308. In the present embodiment, the plasma sheath modifier 312 may modify at least a portion of the sheath 308 into a concave shaped plasma sheath 308b (modified sheath 308b) relative to the bulk plasma 306, or a dome shaped (convex) plasma relative to the bulk plasma 306. Compared to the substrate 112, the shape of the modified sheath 308b may be non-parallel relative to the plane defined by the substrate 112. When the substrate 112 is biased, the ions 310 attracted toward the substrate 112 may travel through the gap "y" between the modifier parts 312a and 312b at a large range of incident angles. In the conventional plasma based processing systems, the plasma sheath closest to the substrate lies parallel to the substrate. When the substrate is biased, the ions travel in a path substantially perpendicular to the plasma sheath, thus substantially perpendicular to the substrate. As a result, the ions in the conventional plasma processing system have incident angles ranging from −5° to +5°, and typically have incident angles close to zero degrees. In the present embodiment, however, the incident angle of the ions 310 may be modified with the modified sheath 308b. As illustrated in FIG. 3a, the modified sheath 308b is multi-angled relative to the substrate. As such, ions 310 traveling perpendicular to the modified sheath 308b may travel in multiple angles. The ions 310 traveling toward the substrate 112 from different portions of the modified sheath 308b may have different incident angles, and the ions 310 will therefore have a large range of incident angles. As illustrated in FIG. 3b, the incident angles of the ions 310 may range between about +60° to about −60°, centered about 0°. In some embodiments, the incident angles of the ions 310 may additionally be modified by the electric field generated by the plasma sheath modifier 312.

Depending on a number of factors including, but not limited to, configurations and properties of the plasma sheath modifier 312, the incident angle of the ions may be additionally modified. Example of such factors may include the horizontal spacing (Y) between the modifier parts 312a and 312b, the vertical spacing (Z) between the modifier 312 and the substrate 112, difference in the vertical spacing (z) between the substrate 112 and each modifier parts 312a and 312b (not shown), and the electrical properties of the modifier 312. Other plasma process parameters may also be adjusted to adjust the incident angle and/or incident angle distribution of the ions. Additional description may be found in the co-pending U.S. patent application Ser. Nos.: 12/418,120, 12/417,929, 12/644,103, and 12/848,354, each of which application, as noted above, is incorporated in its entirety by reference.

By modifying the plasma sheath 312, a three dimensional structure with surfaces oriented at different angles may be treated conformally or isotropically. As noted below, the modified plasma sheath 312 may be used to treat multiple surfaces of 3D structures such as, for example, 3D photoresist reliefs isotropically at the same time.

Referring to FIG. 4, there is shown a technique for processing 3D structures according to one embodiment of the present invention. In the present embodiment, the technique may be used to reduce LER and LWR contained in 3D photoeresist relief 114a. As noted above, LER and LWR may occur in 3D photoresist relief 114a obtained during optical lithography, after uncured portion of the photoresist resist is removed. In the present embodiment, LER and LWR contained in the photoresist relief 114a may be reduced by performing plasma assisted doping (PLAD) or a plasma immersion ion implantation (PIII) process using the plasma sheath modifier 312 on different surfaces of the relief 114a. Those of ordinary skill in the art will recognize that the figure is not necessarily drawn to scale.

As illustrated in FIG. 4, 3D photoresist relief 114a having side surface 114a-1 and top surface 114a-2 may be disposed on the substrate 112. The substrate 112 and the photoresist relief 114a disposed in the plasma processing system containing the plasma sheath modifier 312, and plasma is disposed near the substrate 112. Thereafter, the ions 310 in the plasma may be directed through the gap between the plasma sheath modifier parts 312a and 312b, toward the surfaces of the photoresist relief 114a. As illustrated in the figure, the ions 310 may be directed at multiple incident angles.

In the present embodiment, the ions 310 may be implanted into the top and side surfaces 114a-2 and 114a-1 of the photoresist relief 114a. Although various ion species may be implanted, helium (He) or argon (Ar) ions may be implanted in the present invention. Although the duration of exposure of the resist to ions may cover a wide range, the exposure time may vary from about one second to several minutes.

Experiments were conducted to study the effect on LER of a plasma processing system (PSM system) arranged in accordance with the present invention. As used hereinafter, the term "PSM system" or "PSM plasma system" refers to a plasma processing system that employs a plasma sheath modifier to provide a wide range of angular distribution of ions toward a substrate positioned adjacent to a portion of the plasma. The term "wide," "wide range," or "wide angular range," as used in conjunction with angle of ion incidence, refers to a set of angles that spans a total range of about 5 degrees or larger. A plasma sheath modifier was used to provide an exposure comprising a dose of ions distributed over a wide angular range, as illustrated in FIG. 3b. Referring again to FIG. 4, a set of resist lines having nominal CD of about 40 nm was exposed to a 3 kV He plasma. By implanting He ions 310 into the top 114-2 and side 114a-1 surfaces of the photoresist relief 114a at 3-4 kV, the LER improved from 5.6 to 3.2 nm, and an improvement of about 40% in LER and LWR was observed. By implanting He ions using the plasma sheath modifier 312, the improvements occurred isotropically, on the multiple surfaces 114a-1 and 114a-2 of the photoresist relief 114a, at the same time.

In addition, only minimal critical dimension shrinkage of the photoresist relief 114a was observed. In particular, the measured CD before processing of 39.1 nm was only reduced to 37.6 nm after processing, representing only a 4% shrinkage when the resist relief 114a was implanted with He ions 310 at multiple incident angles. Minimal faceting or sputtering was also observed. As PLAD or PIII process is a low energy process, the depth by which the ions 310 are implanted is very low. As such, any change to the photoresist relief 114a caused by ion implantation such as, for example, resist shrinkage and/or sputtering may be minimal.

Further, concurrent, isotropic hardening of multiple surfaces of the photoresist relief 114a was observed. Concurrent, isotropic hardening of the photoresist relief 114a may be advantageous if additional optical lithographic process is performed to achieve double patterning lithographic (DPL) or self-aligned double patterning lithographic (SADPL) process. In DPL or SADPL, a second lithographic process is performed to generate additional photoresist reliefs between two original photoresist reliefs formed during the first lithographic process. Forming additional photoresist reliefs may decrease the distance therebetween and may lead to a substrate 112 with trenches with even smaller widths. During the second lithographic process, a chemical treatment may be performed. When performed, the structure of the photoresist relief formed during the first lithographic process may be adversely affected. In the present embodiment, isotropically hardened photoresist relief 114a may be able to withstand the chemical treatment associated with the second lithographic process. As such, an additional lithographic process to achieve DPL or SADPL may be possible.

In accordance with other embodiments of the invention, an energy and type of ion may be selected to optimize LER or LWR in patterned resist features subject to multiple angle ion bombardment, as illustrated in FIG. 4. The effect of energy and ion type on resist feature roughness is illustrated in FIGS. 5 and 6. FIG. 5 depicts LER for resist lines before and after exposure (Reference) to ions extracted from a plasma system using a conventional plasma arrangement and using a plasma sheath modifier arranged in accordance with the present invention. Before exposure, an LER of about 4.4 nm is observed. The effect of exposure to a plasma on the resulting LER is shown for a series of plasmas, including Si, Ar, and He plasmas. FIG. 5 also depicts the effect on LER of varying ion energy using the same species for Ar and Si. A substantial reduction in LER is observed under all plasma conditions shown in FIG. 5. The term "substantial," as used herein with respect to roughness parameters, such as LER and LWR, generally refers to a decrease of about 5% or more in a given value. Using a conventional plasma configuration, for silicon ions of 2 kV and 8 kV, LER after plasma exposure decreases to about 3.9 and 4.0 nm, respectively, while for Ar at 2 kV and 8 kV, LER decreases to about 3.8 and 3.7 nm, respectively. Using a PSM configuration of the present invention, however, a much larger decrease is observed for an Ar plasma exposure at 4 kV and an He plasma exposure at 3 kV, where LER decreases to about 2.5 and 2.3 nm, respectively, which is equivalent to a respective 43% and 48% reduction in LER.

In addition to improved LER and LWR, embodiments of the present invention provide improved low and mid frequency roughness, as indicated by FIG. 6. Improvements in low and mid frequency roughness may be especially useful in improving device performance, since both may affect $L_{eff}$, the channel length in a field effect transistor. As is well known, the variation in physical gate dimension of a patterned substrate, in turn, is directly related to the LWR of the resist features used to pattern the underlying gate structure. For devices with relatively smaller overlap between gate and active area, mid frequency roughness components may dominate device performance, while for devices having larger overlap between gate and active area, both mid frequency and low frequency roughness components may affect device performance.

In view of the above, an optimum line roughness for patterned resist features may depend upon the nature of the devices to be fabricated in an underlying substrate using the patterned resist. Accordingly, in embodiments of the present invention, a set of parameters may be tuned to produce an optimum reduction in desired roughness features. These parameters may include, among others, ion type, ion energy, resist type, resist feature size, as well as geometrical features associated with the plasma sheath modifier. With reference again to FIG. 3, the latter features include the horizontal spacing Y, vertical spacing Z, and other factors, which are disclosed in more detail in the co-pending U.S. patent application Ser. Nos.: 12/418,120, 12/417,929, and 12/644,103.

In accordance with further embodiments of the invention, patterned resist features may be subject to an exposure of electromagnetic radiation in addition to a wide angular dose of ions, as provided by the plasma sheath modifier 312. Unless otherwise noted, the term "electromagnetic radiation," as used herein, refers to radiation in the UV-visible-infrared (IR) spectral range. The present inventors recognized that a combination of ion impingement and electromagnetic radiation may act in an additive or synergistic fashion to remove roughness in a resist feature.

In one embodiment, the plasma used to provide the dose of ions to a set of patterned resist features is also employed as a source of UV radiation that is provided to the same resist features. In addition to emitting visible radiation, the ionized gas in plasmas typically emits energetic radiation in the ultraviolet spectral range. It is known that the radiation emitted from plasmas, such as those provided in embodiments of the present invention, is characteristic of relaxation processes of excited species as the species return to a lower energy state. There are typically many such relaxation processes in plasmas including inert gas plasmas, such as Ar or He plasmas. Those processes that result in IR, visible light or UV radiation emission may provide photons of proper energy to impact the resist features and cause change in the photoresist. Exposure to UV radiation using known photolithographic processes causes a previously unexposed positive photoresist to undergo chemical changes that render the exposed portions susceptible to subsequent dissolving in a developer solution. In the present invention, the exposure to IR, visible light or UV radiation of a patterned resist feature (that is, the portion of the original resist that is unexposed during the original lithography process used to form the patterned resist features, and therefore remains on the substrate after development) may induce chemical and/or physical changes. Although the patterned resist feature may be baked after lithographic processing, exposure to electromagnetic radiation, such as UV radiation, may be significant enough to soften or otherwise render the patterned resist more susceptible to ion bombardment from the plasma. In this manner, ion bombardment may be used in conjunction with electromagnetic radiation to improve the surface roughness of patterned resist features.

In the following discussion, for the purposes of illustration, embodiments of the present invention that are set forth focus on the use of UV radiation from a plasma to modify patterned resist features. The in situ exposure of the patterned resist to UV photons during exposure to a wide angular flux of ions from a PSM plasma may enhance the effect on resist roughness that is caused by exposure to wide angular ion flux alone. In this manner, LER and LWR may be more effectively reduced than when a UV radiation dose is not provided. However, the present invention also covers methods and systems that employ an exposure to wide angular ion flux in conjunction with electromagnetic radiation having other wavelengths, such as light whose wavelength is in the visible-(IR) spectrum. Accordingly, the present invention covers systems and methods for providing radiation to patterned resist whose wavelength may be in the UV-visible-IR wavelength range (spectrum).

In embodiments of the present invention, the plasma properties and/or configuration of a plasma system are tailored to provide both a dose of ions over a wide angular range and a dose of UV radiation that is effective in enhancing a reduction in roughness that may be caused by exposure of the resist to the dose of ions.

In an exemplary process, a resist system, a plasma gas composition and set of operating conditions are chosen for use in a PSM plasma system, such that a plasma formed therein provides UV radiation in a set of frequencies configured to introduce a change in the chosen resist system. The plasma gas composition may be based upon a single gas, such as Ar or He, or may comprise a mixture of gases, such as a mixture of inert gases (Ar/He, Ar/Ne, etc.), a fluorocarbon/inert gas mixture, a gas composition containing oxygen, or other gas compositions.

The resist system may be a known resist, such as a resist configured for use with a 193 or 248 nm optical lithography system. In one exemplary method, the gas composition and plasma operating conditions may be chosen to produce UV radiation in the range of 100 nm-300 nm. This range of UV wavelengths may be effective in changing the chemical bonding in resist systems, especially in surface regions of the resist. For example, Ar/fluorocarbon plasma discharges are known to produce UV radiation. In exemplary embodiments, UV photoresist systems, such as known methacrylate-based systems may be used to form patterned photoresist systems. These types of polymers may be configured with pendant groups containing oxygen which may be susceptible to removal upon exposure to UV radiation of a proper wavelength. This may, in turn, lead to chain scission, or other reactions that affect the polymer structure and/or composition.

By altering the polymer structure and/or composition of the patterned photoresist using UV radiation extracted from the PSM plasma, the wide angular ion flux also provided by the PSM plasma may be rendered more effective in reducing roughness in the photoresist features. For example, at least a portion of the photoresist features may be softened by the chemical/physical changes induced by exposure to UV radiation. This softening may facilitate smoothening processes induced by ion impact with the photo resist features.

However, an excess of UV radiation may result in unwanted decomposition of the resist features, or excessive removal of resist, leading to excessive loss of CD or a failure to improve surface roughness. Accordingly, embodiments of the present invention are directed to providing an appropriate dose of UV radiation that may act in an additive or in a synergistic manner with ions extracted from a plasma to improve LWR and LER in patterned resist features.

Figure 7:
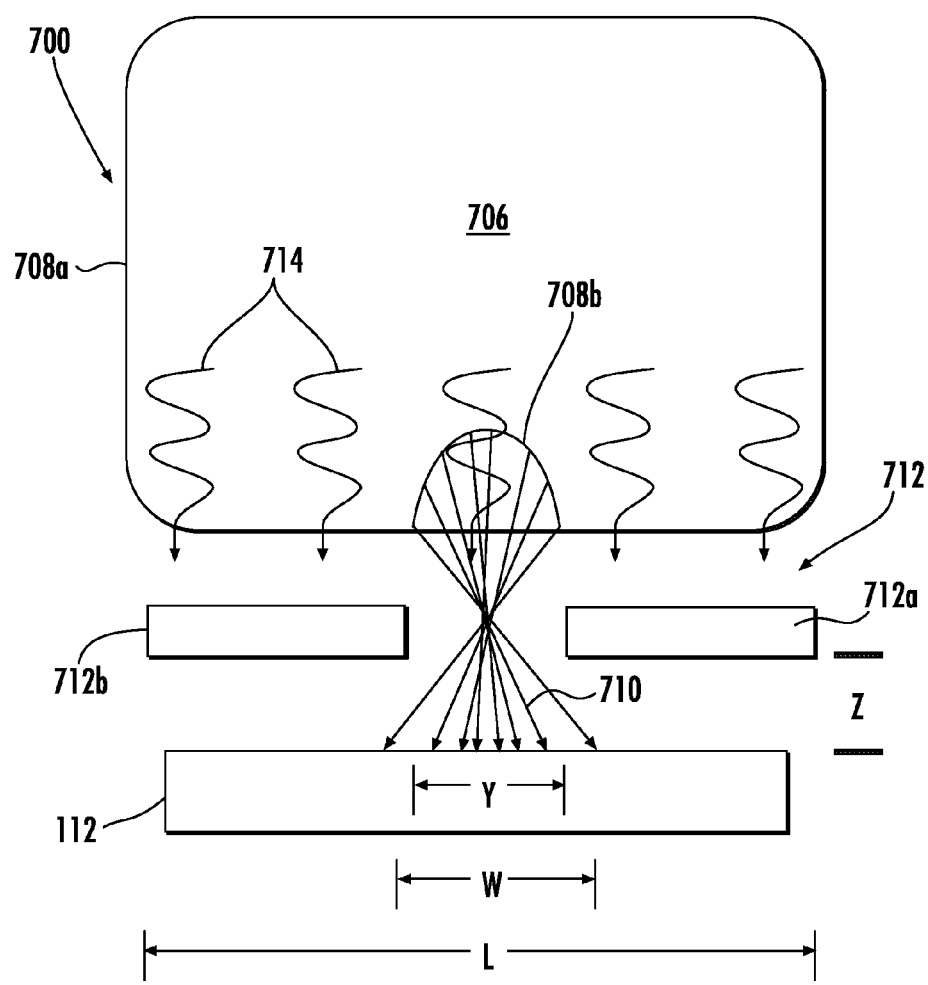
FIG. 7 depicts details of a plasma system arranged in accordance with one configuration of the invention.

FIG. 7 depicts details of a PSM plasma system 700 arranged in accordance with one configuration of the invention. System 700 includes a plasma 706, from which ions 710 and UV photons 714 are emitted towards substrate 112. System 700 may include chamber walls and a substrate holder (both not shown). PSM 712, comprising portions 712a and 712b, induces plasma sheath boundary 708a to form a concave region 708b above an aperture region between portions 712b and 712a. Ions 710 may impinge on substrate 112 over a wide range of angles as shown, leading to improved LER and LWR in resist features, as discussed hereinabove with respect to FIGS. 3a-6. In addition, a portion of UV photons 714 emitted from plasma 706 may be provided to substrate 710. For example, while plasma 706 is ignited, electromagnetic radiation including IR, visible light and UV photons may be emitted over a wide range of angles. For simplicity, only a set of photons directed orthogonally toward substrate 112 are shown.

In accordance with the present invention, and detailed below, plasma 706 and plasma sheath modifier 712 act as a source of UV radiation for substrate 112. By choice of plasma gas composition, PSM material, and geometrical configuration of PSM 712, the exposure of substrate 112 to UV radiation 714 may be tuned.

Figure 7A:
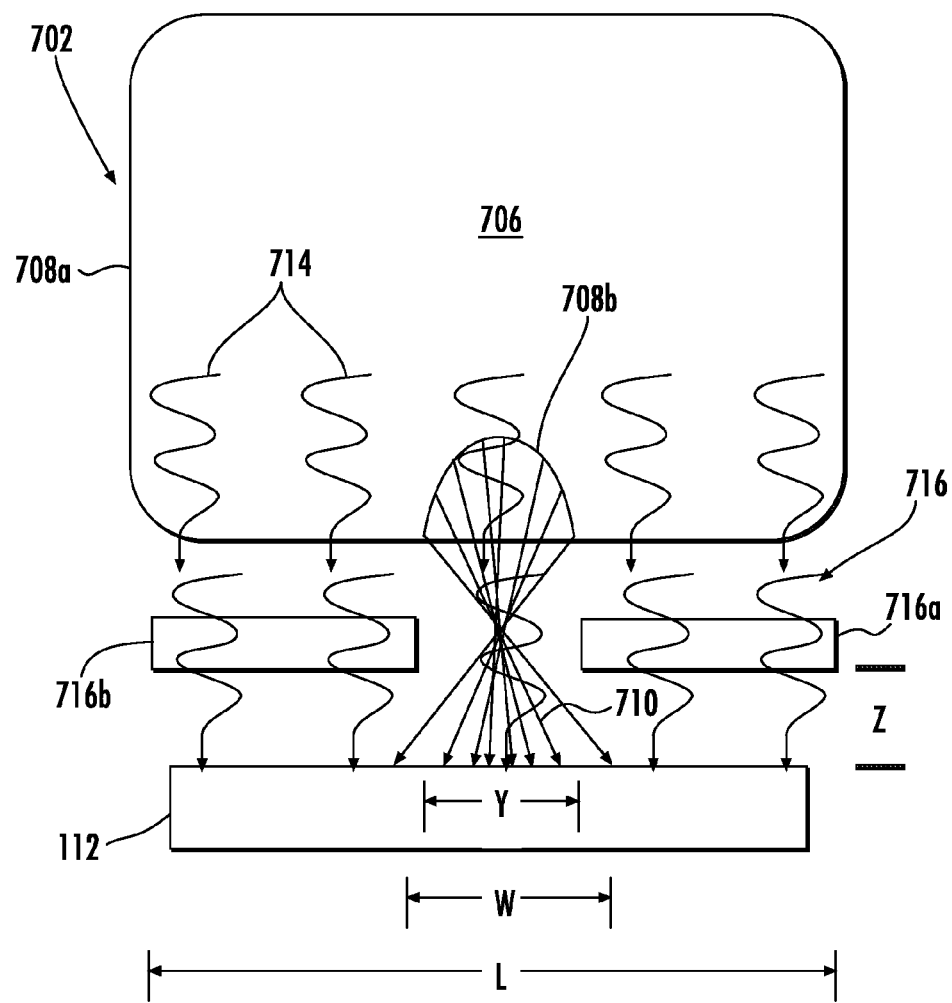
FIG. 7a depicts an exemplary system configuration in which a PSM is configured to transmit UV photons emitted from a plasma.

FIG. 7a depicts a system configuration 702 in which PSM 716 transmits UV photons 714, such that the photons emitted from plasma 706 impinge across the entire surface of substrate 112. PSM 716 may comprise a material that is highly transmissive to UV radiation over a desired frequency range. For example, as discussed above, a patterned resist feature (not shown) provided on substrate 112 may comprise a photoresist sensitive to UV radiation in the 180 nm to 250 nm wavelength range. In other words, the photoresist may be susceptible to undergoing chemical and/or physical changes when subject to 180-250 nm wavelength radiation. Accordingly, PSM 716 may comprise a material that is highly transmissive to radiation in the 180-250 nm range, in order to transmit UV photons 714 to the entire substrate 112, as depicted in FIG. 7a. For example, PSM 716 may comprise a fused silica material having a cutoff frequency below about 180 nm. Alternatively, for use with a photoresist that is sensitive to radiation in the 130-150 nm range, PSM 716 may comprise a CaF$_2$ material that is highly transmissive down to about 130 nm wavelength. PSM 716 may comprise more than one material including a stack comprising different insulators, a bulk portion of the PSM coated on one or more sides with a thin film. Materials such as aluminum oxides, silicon oxides, wide bandgap semiconductors, and other materials may be used at least in part to form PSM 716.

By providing a PSM that transmits UV radiation, this embodiment facilitates exposure of substrate 112 to both UV radiation and ion bombardment while a plasma 706 is present. For example, PSM 716 may be provided with a mechanism (not shown) that is configured to provide a relative lateral translational motion between PSM 716 and substrate 112. This mechanism may be activated to move the aperture of PSM 716 over the entire substrate in the +/− directions defined by L, thereby providing exposure of the entire substrate to ions 710 during a scan. It will be apparent that during such a scan, or series of scans, only a portion of substrate 112 defined by lateral dimension w is subject to exposure to ions 710 at any given instance, while the entire substrate 112 may be subject to UV radiation 714 during the entire scan. Accordingly, the configuration of FIG. 7a is useful for resist systems that may require a relatively larger amount of UV flux as compared to ion flux to induce desired chemical or physical changes, which may ions 710 to reduce LWR or LER.

Figure 7B:
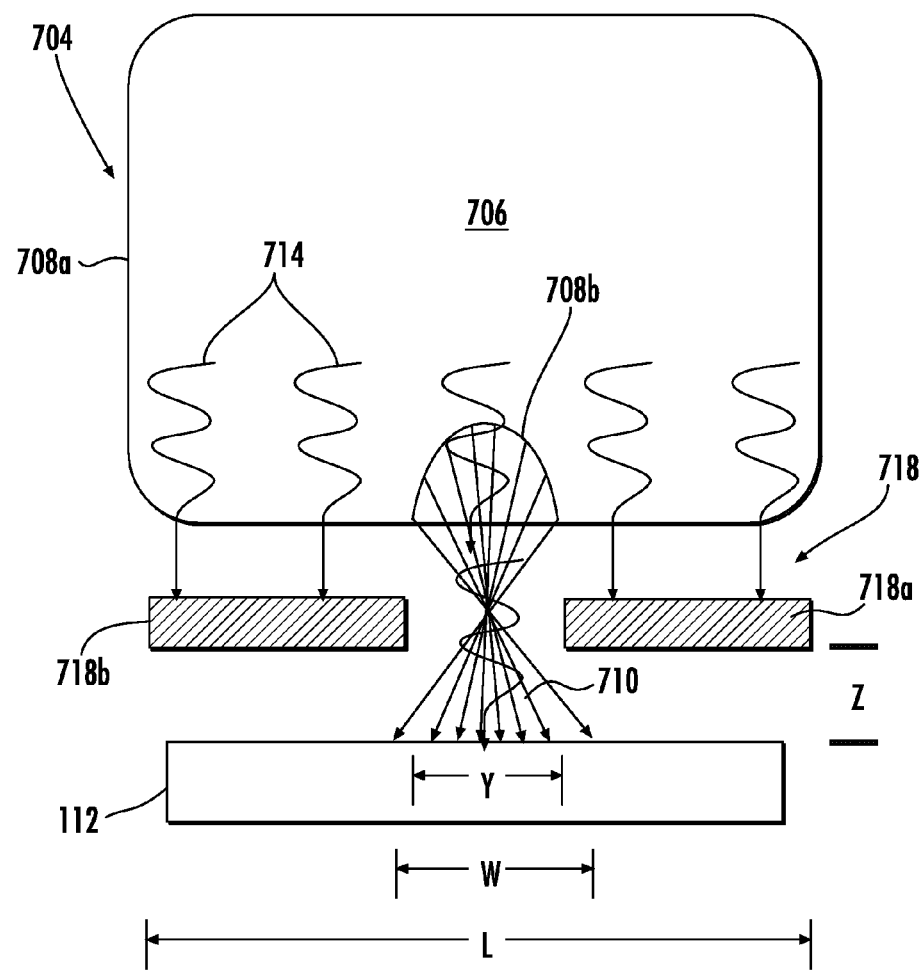
FIG. 7b depicts an exemplary system configuration in which a PSM is configured to block UV photons emitted from a plasma.

FIG. 7b depicts an exemplary system configuration 704 in which PSM 718 blocks UV photons 714, such that the UV photons emitted from plasma 706 are prevented from striking substrate 112, except in a region below the aperture that forms between portions 718a and 718b. PSM 718 may comprise any material that blocks UV photons 714. In this configuration, if a scanning mechanism is applied, at any given instant, regions of substrate 112 that receive ion flux (shown by region w) may be comparable to or somewhat larger than regions that receive UV photons (see region y). Accordingly, the configuration of FIG. 7b may useful for resist systems that may require a relatively lesser amount of UV flux as compared to ion flux to induce desired chemical or physical changes that act in conjunction with the wide angular ion flux to reduce LWR or LER.

Figure 7C:
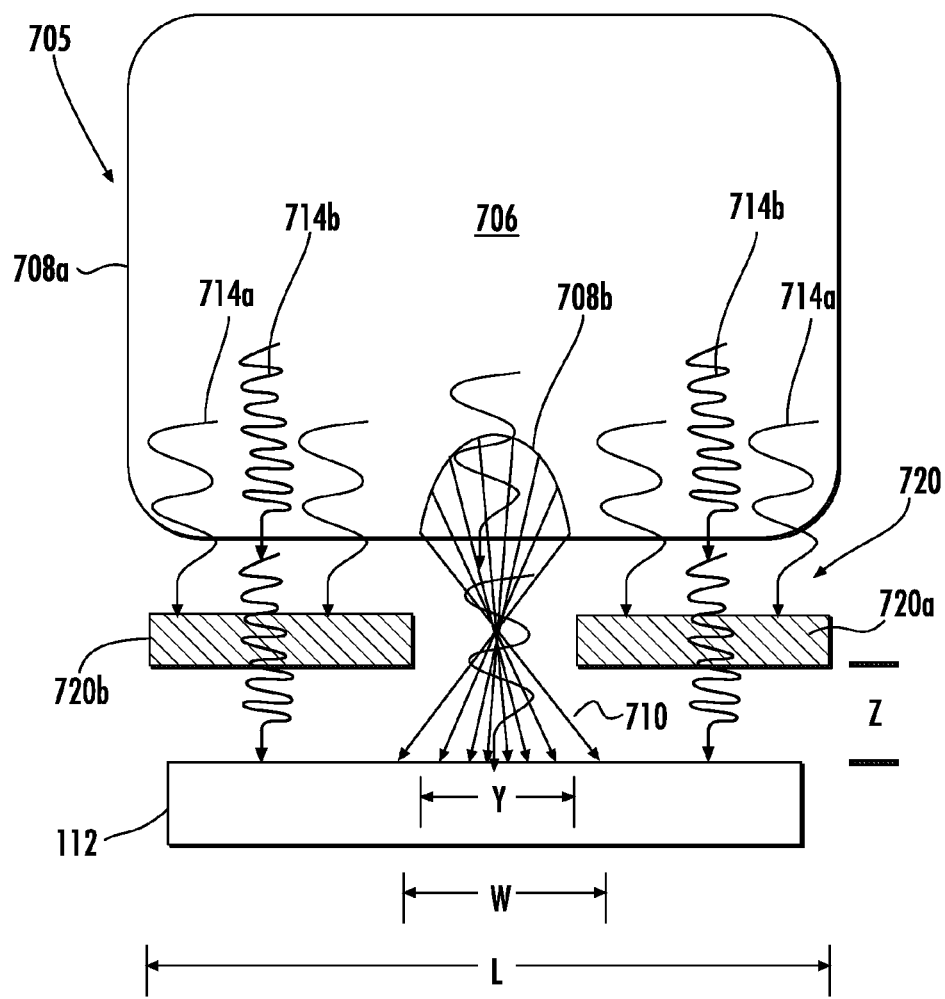
FIG. 7c depicts an exemplary system configuration in which a PSM is configured to selectively transmit UV photons emitted from a plasma.

FIG. 7c depicts a system configuration 705 in which PSM 720 partially blocks UV photons 714, such that the UV photons emitted from plasma 706 are selectively transmitted by PSM 720 based on the photon wavelength. For example, PSM 720 may selectively transmit in a first UV range, and may block radiation in a second UV range. This selectivity may be accomplished by using known materials for fabricating PSM 720. It is well known that addition of dopants to oxide materials, such as silica-based materials, may alter the transmissivity of silica in the UV range. Thus, PSM 720 may comprise a bulk material that transmits UV radiation in only a portion of the UV spectrum. Alternatively, PSM 720 may comprise a layer structure that acts as a filter to pass only a specific range or ranges of UV wavelengths. For example, PSM 720 may be configured to pass radiation in two different wavelength ranges that are separated by a blocked wavelength range, meaning a wavelength range where radiation is not transmitted through the PSM. Such filters may include multiple oxide layers, semiconductor and oxide layers, and other combinations. The multiple layer structure may comprise, for example, a plurality of layers of comparable thickness or may comprise a bulk layer having a thin film coating on one or more surfaces. Accordingly, in the configuration of FIG. 7c, at any given instant, all UV wavelengths of photons (represented by photons 714a, 714b) that are emitted from plasma 706 may reach substrate 122 in region 'y,' while over the larger region L, only UV photons of non-filtered wavelengths 714b are transmitted through PSM 720 to reach substrate 112.

Thus, the PSM configuration of FIG. 7c may be useful for resist systems in which a select wavelength range (714b) aids ions 710 in reducing LWR, while a non-favored range (714a) does not aid in reducing LWR and/or has a deleterious effect on LWR or other resist properties, such as the ability to withstand further lithographic processing (resist "hardness").

Figure 8:
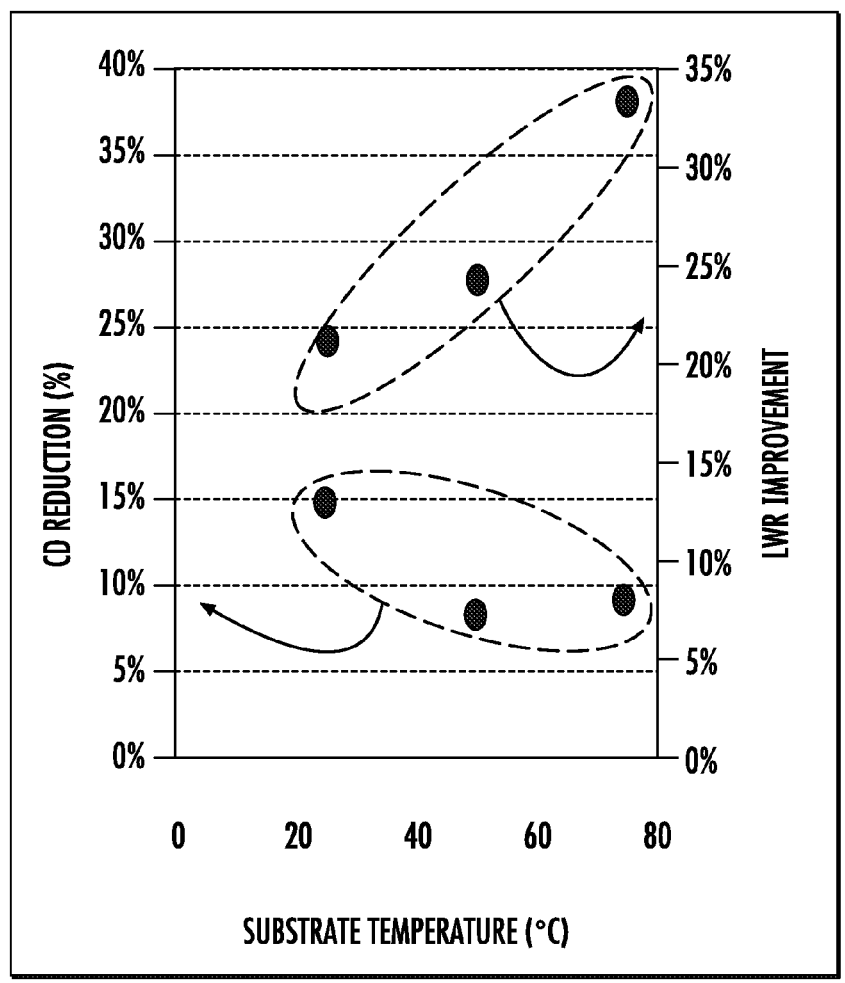
FIG. 8 is a graph that presents exemplary LWR and CD data at various substrate temperatures, in accordance with a configuration of the present invention.

In a further embodiment of the invention, substrate temperature may be adjusted while a patterned resist structure is exposed to the wide angular ion flux provided by use of a PSM, such as the structures depicted in FIGS. 3a, and 7-7c. FIG. 8 provides the results of experimental measurements for resist features subjected to 4 kV Ar ion bombardment at various substrate temperatures, using a plasma system configured with a PSM in accordance with a configuration of the present invention. Increasing the substrate temperature from room temperature to 75° C. reduces the amount of CD loss caused by the Ar ion treatment, and substantially increases the improvement in LWR. It will be appreciated that greater increases in substrate temperature may produce further improvements in LWR/LER. However, the degree to which substrate temperature can be increased may be limited by the onset of decomposition, softening, or melting processes at elevated temperatures.

The aforementioned exemplary systems, methods, and compositions may, in general, be used in any combination to provide improved roughness results, such as reductions in LWR/LER, reductions in high, low, and medium frequency roughness variations, and similar patterned resist attributes.

Figure 9:
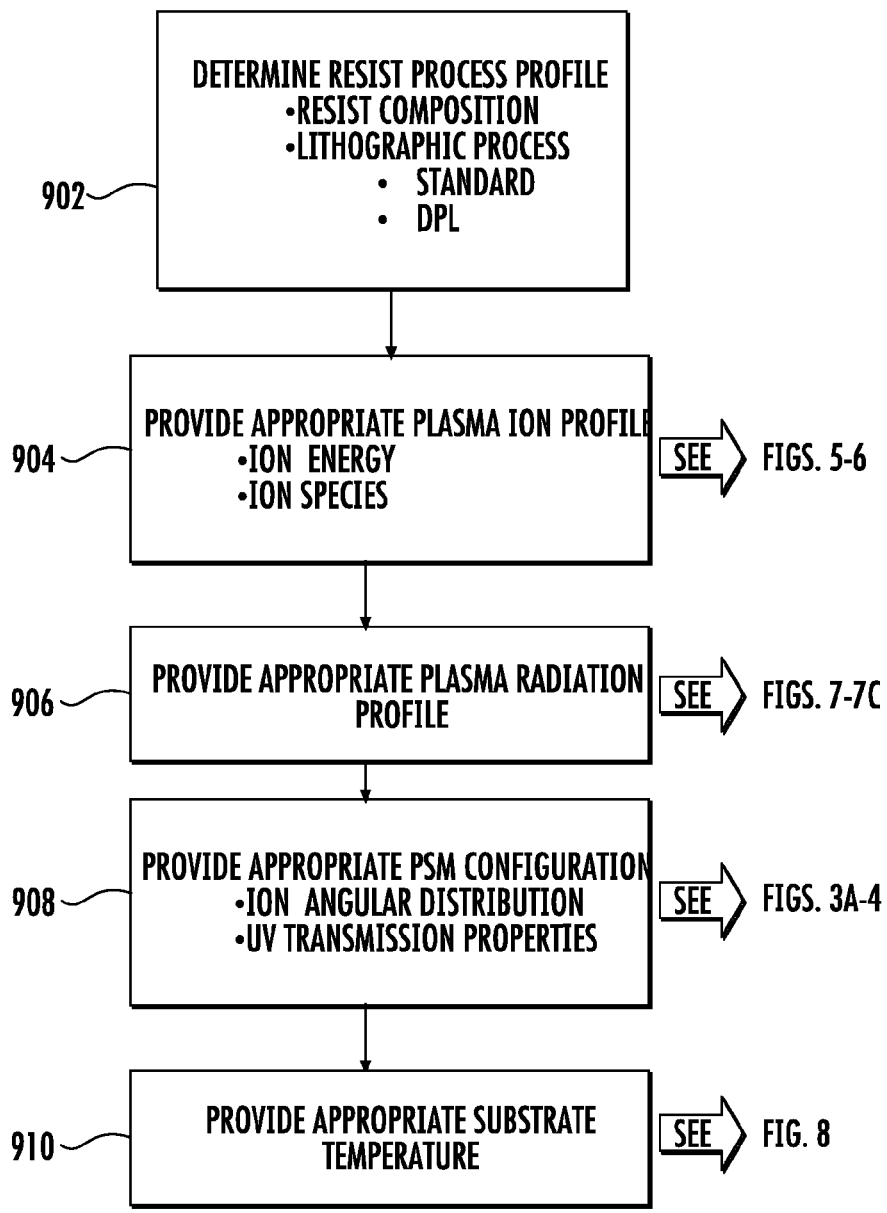
FIG. 9 provides a summary that illustrates exemplary steps involved in a method of the present invention.

FIG. 9 provides a summary that illustrates exemplary steps involved is a method of reducing roughness in patterned resist features, according to embodiments of the present invention. For some of the steps, bulleted selection criteria are also provided, which may comprise exemplary substeps of the method. At step 902, a resist process profile is determined. The process profile may involve, for example, the type of resist being used to form the patterned photoresist features. For example, this may be a standard industry resist, or it may be a resist profile developed for a particular application. The resist process profile also may involve the type of photolithographic processing to be employed that produces the patterned resist features. For example, the process may be a standard lithographic process, or it may involve a double patterning process that requires a more robust resist to withstand additional photolithographic process steps employed after the plasma treatments afforded by the present invention.

At step 904, an appropriate plasma ion profile is provided. The term "plasma ion profile" refers to parameters of a plasma used to treat the patterned resist, including the energy and type of ions provided to a substrate. As illustrated in FIGS. 5 and 6, these parameters may have a strong influence on the reduction in LWR/LER as well as the specific reduction in short and medium length roughness. The plasma ion profile may be provided to a control system for operating a PSM plasma in a plasma immersion implantation system, in order to initiate the plasma when a substrate having a patterned resist layer is placed in the system.

The appropriate plasma ion profile may also include information concerning the appropriate ion dose. This dose information, in turn, may be based on design criteria, such as a target LWR, as well as process factors, such as a set of further process steps to be performed on the patterned resist. For example, a target device design may require that resist features have a target LWR and/or low frequency roughness, thus placing requirements on a first lithographic process used to produce the resist features. The first lithographic process may be part of a double patterning process flow, in which a second lithographic process is to be deployed. For a given ion energy and angular distribution, it may be known, or may be experimentally determined, that a first ion dose may be effective to cause a maximum reduction in LWR of the patterned resist after the first lithographic process, while higher ion doses do not substantially affect roughness. It may further be known or empirically determined that a second ion dose that is greater than the first ion dose is more effective than the first ion dose at hardening the patterned resist. Thus, exposing the patterned resist to the second ion dose may result in less CD loss or other deleterious effects after the second lithographic process is applied to the resist. Accordingly, the appropriate ion dose may be the second ion dose, which achieves both the required LWR and the required resist hardening to prepare the resist for the second lithographic process.

In an alternative example, if LWR reaches a minimum at the first ion dose, but increases at ions doses that are greater than the first dose, it may be less desirable to use a higher ion dose. Accordingly, an optimum dose may be selected that is between the first and second dose, representing a compromise between optimizing LWR and improving hardness against deleterious effects that may occur during the second lithographic process.

At step 906, an appropriate plasma radiation profile is provided to a process system, such as a plasma ion implantation system having a plasma sheath modifier of the present invention. The term "plasma radiation profile," as used herein, refers the electromagnetic radiation characteristics from a plasma, which result from factors including the choice of gas species, as detailed above. This plasma radiation profile may be selected to enhance the resist-smoothening effect resulting from bombardment of ions extracted from the same plasma. Thus, providing the appropriate plasma radiation profile may comprise selecting gas species and plasma operating conditions that are configured to generate radiation in a desired wavelength range when the plasma is initiated. In one example, the providing of ion species of step 904 and providing of a plasma radiation profile of step 906 may involve selecting a gas species that provides both a smoothening effect attributable to ion bombardment, as well as an enhancement of this effect attributable to UV radiation. For example, a low energy Ar process may be identified that provides a smoothening effect on patterned resist features that can be attributable to exposure to energetic Ar ions extracted from the plasma. The low energy Ar process may also emit UV photons of a frequency that enhances the smoothening effect for a given resist system.

In another example, the choice of ion species of step 904 and of a plasma radiation profile of step 906 may involve selecting a plurality of gas species in which one gas species supplies a smoothening effect attributable (at least in part) to ion bombardment, while a second gas species supplies an enhancement of smoothening that is attributable (at least in part) to UV radiation. For example, an Ar ion-based process may be identified that provides a smoothening effect on patterned resist features that can be attributable to exposure to energetic Ar ions extracted from the plasma. In addition, it may be known or experimentally determined that a fluorocarbon species emits radiation, such as UV photons that are of an energy that is effective in providing an enhanced smoothening effect. Accordingly, a plasma gas composition may be designed that includes a mixture of Ar/fluorocarbon species that is operable to supply both effective ion bombardment and effective radiation exposure to a patterned resist feature, wherein an enhanced smoothening effect may be produced.

At step 908, an appropriate PSM configuration is provided, which may include providing an appropriate PSM geometry, as well as an appropriate set of properties of the material from which the PSM is constructed. The appropriate set of properties may include the appropriate transmissivity of electromagnetic radiation in a wavelength range of interest (transmission profile). In one example, the PSM has a UV transmission profile that is configured to transmit UV radiation in a wavelength range effective for altering a photoresist.

As discussed previously, the plasma sheath modifiers of the present invention may provide a broad angular flux of ions over about a +/−60 degree range centered around a normal direction to the substrate. However, this distribution may be tailored to specific resist systems and geometries to provide a lesser or greater angular range of incident ions, by, for example, providing a relative adjustment in the vertical (z) and horizontal (y) spacings discussed previously. In addition, as detailed above, the choice of material used in the PSM may be varied to tailor the amount and wavelength of UV radiation that reaches the patterned resist.

At step 910, the substrate that supports the patterned resist is provided with an appropriate temperature during exposure to the PSM plasma, which may involve elevating the substrate temperature above room temperature to effect a larger decrease in LWR of LER, for example.

The methods described herein, such as the aforementioned steps of FIG. 9, may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

Figure 10A:
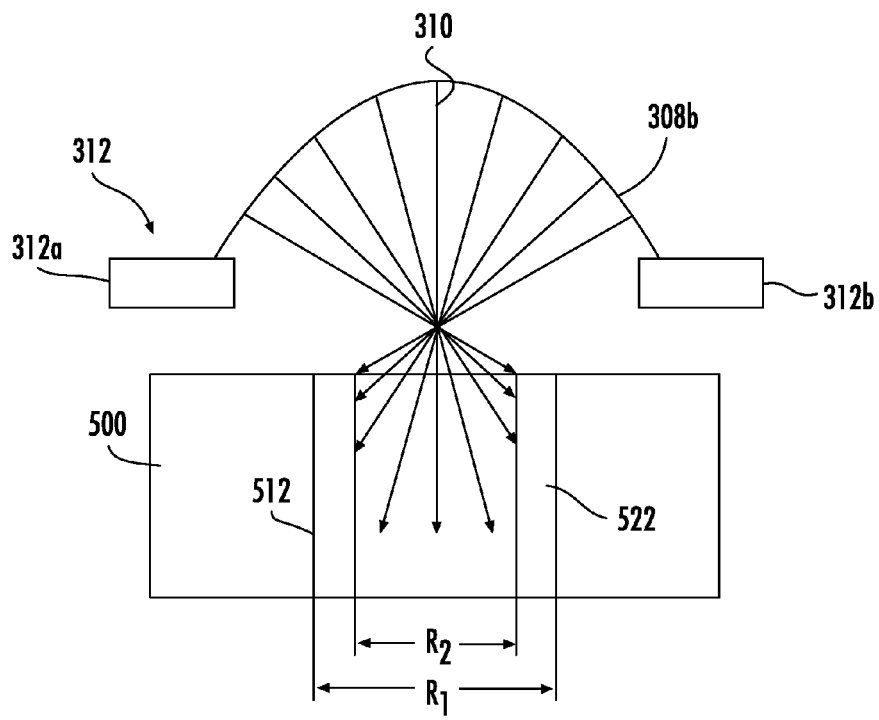
FIGS. 10a and 10b show, in cross-section and plan view, respectively, an illustration of a technique for processing a 3D structure, according to another embodiment of the present invention.
Figure 10B:
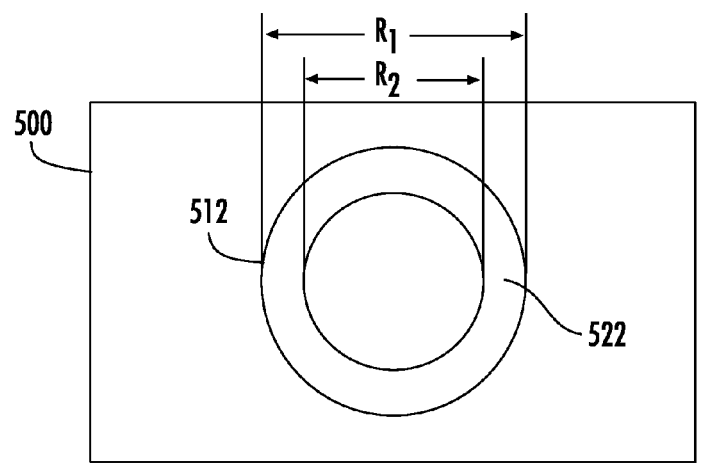

Although the aforementioned embodiments of the invention are generally directed to systems and processes that employ ion bombardment for reducing roughness in surface features, as well as reducing the loss in critical dimension that may occur with such smoothening processes, other embodiments provide mechanisms that employ ion bombardment for adding material to surface patterned features. Referring to FIGS. 10a and 10b, there are shown a simplified illustration of a technique for processing a 3D structure, according to another embodiment of the present disclosure. In this embodiment, a technique for decreasing the area of a hole is shown. In this embodiment, the substrate 500 may be a metallic substrate, a semiconducting substrate, or dielectric substrate. The substrate 500 may comprise a hole 512. Although the present embodiment may be described in context to processing a substrate having a hole with first radius $R_1$, the present disclosure is not limited thereto. Similar to the photoresist of the earlier embodiment, the substrate 500 in the present embodiment may simply be a structure having one or more vertically extending surfaces.

In the present embodiment, ions 310 are directed toward the sidewall of the hole 512 at multiple incident angles. Although ions are preferred, the present invention does not preclude other particles including radicals or other neutrals. The ions 310 directed toward the surface of the hole 512 may then be deposited onto the surface of the hole 512 thereby forming a boundary layer 522 having a second radius $R_2$. By using the plasma sheath modifier 522, the ions 310 may be directed toward the surface of the hole 512 at multiple incident angles. As a result, a conformal, isotropic deposition may occur, and the boundary layer 522 with uniform thickness may form. Further, a radius of the original hole in the substrate 500 may decrease from $R_1$ to $R_2$, conformally and uniformly.

In summary, the present invention provides novel and inventive methods and systems for reducing roughness in patterned features, such as photoresists. The present invention can be deployed in systems that employ relatively low ion energy, such as plasma immersion systems, which affords the ability to provide ions and other species that have only a small penetration depth into the patterned features. This facilitates the ability to provide surface smoothening without substantially impacting resist pattern attributes, such as profile, and CD. By providing a substantial flux of ions at angles far from the normal, the PSM architecture of the present invention is especially effective in attacking resist features in areas most directly affected by surface roughness, that is, the resist sidewalls. Embodiments of the present invention, such as those employing inert gas plasmas, are not susceptible to pattern dependent effects that are prevalent using dry chemical processes, such as RIE. Furthermore, by employing a plasma sheath modulator in conjunction with plasma process systems, such as immersion implantation systems, the present invention offers a large flexibility for tailoring resist treatment processes. This is due to the variety of experimental parameters that can be conveniently and independently tuned, such as gas composition, ion energy, range of angles of incidence of ions, plasma radiation profile, PSM transmission profile, and substrate temperature.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Although the present invention may be deployed in plasma immersion ion implantation systems using low energy ions, ion bombardment effects other than, or in addition to ion implantation, may contribute to resist smoothening, and the present invention may be deployed in other plasma systems capable of providing low energy ions. Furthermore, the present invention covers systems and methods in which IR/visible light radiation emitted from a PSM plasma is effective in reducing surface roughness. In such embodiments, the plasma radiation profile may be chosen, at least in part, based on IR/visible light emission characteristics, and the PSM configuration may be chosen based upon the blocking or transmission characteristics of the PSM in one or more ranges of the IR/visible spectrum.

Moreover, in addition to implanting or depositing, the techniques disclosed in the present disclosure may be used to perform etching on the photoresist structure or a structure other than the photoresist structure. For example, the techniques disclosed in the present disclosure may be used to perform photoresist trim process to reduce the critical dimension of the gate on a transistor. Contrary to the conventional trim process where the trim process is performed one surface at a time using by $O_2$+HBr plasma, the technique of the present disclosure may be used to direct etching agents (e.g. ions) at multiple angles and perform the trim process isotropically on multiple surfaces at the same time. As such, the trim process may be performed much efficiently and more uniformly. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A system for processing resist features disposed on a substrate, comprising:
   a plasma source configured to generate a plasma having a plasma sheath; and
   a plasma sheath modifier disposed between the plasma and the substrate, the plasma sheath modifier configured to control a shape of a boundary defined between the plasma and the plasma sheath such that a portion of the shape of the boundary is not parallel to a plane defined by the substrate in front of the plasma, the plasma sheath modifier configured to transmit electromagnetic radiation having a desired wavelength range, the electromagnetic radiation being emitted from the plasma, and the plasma sheath modifier disposed directly adjacent the substrate and including an aperture dimensioned to allow direct transmission of ions together with electromagnetic radiation to a first section of the substrate, and simultaneous transmission of only electromagnetic radiation to a second section of the substrate adjacent the first section of the substrate.

2. The plasma processing system of claim 1, wherein the plasma sheath modifier is configured to block an electromagnetic radiation range outside of the desired wavelength range.

3. The plasma processing system of claim 2, wherein the desired wavelength range is a UV wavelength range.

4. The plasma processing system of claim 2, wherein the desired wavelength range is an IR wavelength range.

* * * * *